(12) United States Patent
Bang et al.

(10) Patent No.: US 11,749,713 B2
(45) Date of Patent: Sep. 5, 2023

(54) CAPACITOR INCLUDING PEROVSKITE MATERIAL, SEMICONDUCTOR DEVICE INCLUDING THE CAPACITOR, AND METHOD OF MANUFACTURING THE CAPACITOR

(71) Applicant: Samsung Electronics Co., Ltd., Suwon-si (KR)

(72) Inventors: Jeongil Bang, Suwon-si (KR); Seungwoo Jang, Suwon-si (KR); Hyosik Mun, Hwaseong-si (KR); Younggeun Park, Suwon-si (KR); Jooho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/851,836

(22) Filed: Jun. 28, 2022

(65) Prior Publication Data

US 2022/0328615 A1  Oct. 13, 2022

Related U.S. Application Data

(63) Continuation of application No. 17/096,239, filed on Nov. 12, 2020, now Pat. No. 11,417,724.

(30) Foreign Application Priority Data

Jul. 8, 2020 (KR) .................. 10-2020-0084344

(51) Int. Cl.
*H01L 21/00* (2006.01)
*H01L 49/02* (2006.01)
(Continued)

(52) U.S. Cl.
CPC ............. *H01L 28/60* (2013.01); *H01L 28/56* (2013.01); *H10B 53/30* (2023.02); *H01L 21/02197* (2013.01); *H01L 21/02266* (2013.01)

(58) Field of Classification Search
CPC ... H01L 28/60; H01L 28/56; H01L 21/02197; H01L 21/02266; H10B 53/30
See application file for complete search history.

(56) References Cited

U.S. PATENT DOCUMENTS 5,953,619 A    9/1999  Miyazawa et al.
6,525,357 B1   2/2003  Amano et al.
(Continued)

FOREIGN PATENT DOCUMENTS

EP    1094507 A2    4/2001
JP    2003-045987 A 2/2003
(Continued)

OTHER PUBLICATIONS

Hieda et al., "All Perovskite Capacitor (APEC) Technology for (Ba, Sr) Tio3 capacitor Scaling toward 0.10 um Stacked DRAM," IEEE, pp. 30.2.1-30.2.4, 1998.
(Continued)

*Primary Examiner* — Richard A Booth
(74) *Attorney, Agent, or Firm* — HARNESS, DICKEY & PIERCE, P.L.C.

(57) ABSTRACT

A capacitor includes a lower electrode, a first dielectric layer provided on the lower electrode including a perovskite structure, an upper electrode including a perovskite structure, a first dielectric layer between provided on the lower electrode and the upper electrode; and a second dielectric layer, having a band gap energy greater than that of the first dielectric layer, provided between on the first dielectric layer and the upper electrode, the capacitor may have a low leakage current density and stable crystallinity, thereby suppressing a decrease in a dielectric constant.

19 Claims, 7 Drawing Sheets

(51) Int. Cl.
  *H10B 53/30*     (2023.01)
  *H01L 21/02*     (2006.01)

(56)     References Cited

U.S. PATENT DOCUMENTS

| | | |
|---|---|---|
| 7,122,851 B2 | 10/2006 | Itokawa et al. |
| 8,102,023 B2 | 1/2012 | Tanioku |
| 2009/0230511 A1 | 9/2009 | Park |
| 2011/0102968 A1* | 5/2011 | Choi .................. H01L 28/91 |
| | | 427/79 |
| 2013/0113079 A1 | 5/2013 | Malhotra et al. |

FOREIGN PATENT DOCUMENTS

| | | |
|---|---|---|
| JP | 2010-165722 A | 7/2010 |
| KR | 10-2007-0021498 A | 2/2007 |
| KR | 10-2009-0022332 A | 3/2009 |
| KR | 10-2014-0092421 A | 7/2014 |

OTHER PUBLICATIONS

Non-Final Office Action dated Dec. 13, 2021 in U.S. Appl. No. 17/096,239.
Notice of Allowance dated Apr. 18, 2022 in U.S. Appl. No. 17/096,239.
CA Non-Final Office Action dated Feb. 16, 2023 in U.S. Appl. No. 17/853,290.

* cited by examiner

CAPACITOR INCLUDING PEROVSKITE MATERIAL, SEMICONDUCTOR DEVICE INCLUDING THE CAPACITOR, AND METHOD OF MANUFACTURING THE CAPACITOR

CROSS-REFERENCE TO RELATED APPLICATION

This application is a Continuation of U.S. application Ser. No. 17/096,239, filed on Nov. 12, 2020, which is based on and claims priority under 35 U.S.C. § 119 to Korean Patent Application No. 10-2020-0084344, filed on Jul. 8, 2020, in the Korean Intellectual Property Office, the disclosure of each of which is incorporated by reference herein in its entirety.

BACKGROUND

1. Field

The present disclosure generally relates to a capacitor including a perovskite material, a semiconductor device including the capacitor, and a method of manufacturing the capacitor.

2. Description of Related Art

In recent years, as the trend towards high functionality, high efficiency, miniaturization, and weight reduction of electronic devices has progressed rapidly, the demand for miniaturization and higher performance of electronic components has increased at a rapid pace, and the demand for electronic components with high reliability has also increased significantly.

A capacitor is one such electronic component. In order to manufacture a capacitor with high capacitance, a dielectric constant related to the amount of charges that can be stored per unit area of a dielectric layer for the capacitor needs to be sufficiently high. In accordance with the trend towards high integration of electronic components, not only the physical properties of materials have been improved, but also structural improvements have been made through the improvement of process capability. However, in a situation where the improvement of the physical structures of electronic components has reached its limit, the development of new materials is required to realize properties beyond those of materials used in the past.

In order to replace the materials used in the past, like silicon oxide and/or aluminum oxide, which have been used as materials for dielectric layers for capacitors, oxides such as hafnium dioxide ($HfO_2$), zirconium oxide ($ZrO_2$), tantalum oxide ($Ta_2O_5$), and titanium dioxide ($TiO_2$), and perovskite-based oxides such as strontium titanate ($SrTiO_3$) and (Ba, Sr)$TiO_3$ have been studied as materials having high dielectric constants. In addition, in order to reduce the leakage current of a capacitor, the use of a dielectric layer having a high bandgap energy and/or an electrode having a high work function have been explored as components in capacitors.

However, the dielectric constant of the dielectric layer and the leakage current of the capacitor are in a trade-off relationship. Thus, in order to implement a capacitor having a high dielectric constant and a low leakage current, a method of manufacturing a capacitor in which a dielectric layer having a high dielectric constant and low bandgap energy and a dielectric layer having a low dielectric constant and high bandgap energy are stacked has been explored.

SUMMARY

Provided are capacitors in which a decrease in a dielectric constant is suppressed and which has a low leakage current density.

Provided are semiconductor devices including the capacitors.

Provided are methods of manufacturing the capacitors.

Additional aspects will be set forth in part in the description which follows and, in part, will be apparent from the description, or may be learned by practice of the presented embodiments of the disclosure.

According to an aspect of an example embodiment, a capacitor may include a lower electrode including a perovskite structure, an upper electrode including a perovskite structure, a first dielectric layer between the lower electrode and the upper electrode, and a second dielectric layer, having a band gap energy greater than that of the first dielectric layer, between the first dielectric layer and the upper electrode.

The degree of a lattice mismatch between the lower electrode and the first dielectric layer may be about 5% or less.

The degree of a lattice mismatch between the lower electrode and the second dielectric layer may be about 5% or less.

The lower electrode and the upper electrode may each include at least one of SRO, SIO, SVO, SNO, SCO, or SMO. For example, the lower electrode and upper electrode may each include at least one of $SrRuO_3$, $SrMoO_3$, $SrIrO_3$, $SrVO_3$, $SrNbO_3$, or $SrCoO_3$.

The first dielectric layer may include at least one of SRO, SIO, SVO, SNO, SCO, or SMO. For example, the first dielectric layer may include at least one of $SrTiO_3$, $BaTiO_3$, or (Ba, Sr)$TiO_3$.

The second dielectric layer may include at least one of SZO or SHO. For example, the second dielectric layer may include at least $SrZrO_3$ or $SrHfO_3$.

The capacitor may further include a third dielectric layer between the first dielectric layer and the lower electrode, the third dielectric layer having a band gap energy greater than that of the first dielectric layer.

The degree of a lattice mismatch between the lower electrode and the third dielectric layer may be about 5% or less.

The capacitor may include a plurality of first dielectric layers and a plurality of second dielectric layers.

The plurality of first dielectric layers and the plurality of second dielectric layers may be alternately stacked on each other.

The plurality of first dielectric layers may include two first dielectric layers, and the plurality of second dielectric layers may include two second dielectric layers.

The ratio of the thickness of the first dielectric layer to the total thickness of the first dielectric layer and the second dielectric layer may be about 70% or more, and the ratio of the thickness of the second dielectric layer to the total thickness of the first dielectric layer and the second dielectric layer may be about 30% or less.

The total thickness of the first dielectric layer and the second dielectric layer may be about 30 nm to about 200 nm.

The thickness of the first dielectric layer may be greater than or equal to about 70 nm and less than about 100 nm.

The thickness of the second dielectric layer may be greater than 0 nm and less than or equal to about 30 nm.

According to an aspect of another embodiment, a semiconductor device includes a transistor and a capacitor connected thereto.

The capacitor included in the semiconductor device may include a lower electrode including a perovskite structure, an upper electrode including a perovskite structure, a first dielectric layer between provided on the lower electrode and the upper electrode; and a second dielectric layer, having a band gap energy greater than that of the first dielectric layer, provided between on the first dielectric layer and the upper electrode.

The degree of a lattice mismatch between the lower electrode and the first dielectric layer may be about 5% or less, and the degree of lattice mismatch between the lower electrode and the second dielectric layer may be about 5% or less.

The lower electrode and the upper electrode may each include at least one of $SrRuO_3$, $SrMoO_3$, $SrIrO_3$, $SrVO_3$, $SrNbO_3$, or $SrCoO_3$.

According to an aspect of another embodiment, a method of manufacturing a capacitor includes forming a lower electrode having a perovskite structure, forming a first dielectric layer on the lower electrode, the first dielectric layer having a first dielectric constant and a first band gap energy, forming a second dielectric layer on the first dielectric layer, the second dielectric layer having a second dielectric constant less than the first dielectric constant and a second band gap energy greater than the first band gap energy, and forming an upper electrode having a perovskite structure on the second dielectric layer.

The forming of the lower electrode, the first dielectric layer, the second dielectric layer, and the upper electrode may include at least one of pulsed laser deposition (PLD), sputtering, and molecular beam epitaxy (MBE).

The forming of the first dielectric layer may include using a target material in which strontium (Sr) and barium (Ba) are mixed at a 1:1 ratio.

The forming of the second dielectric layer may include using a target material in which strontium (Sr), hafnium (Hf), and zirconium (Zr) are mixed.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, capacitors each including a perovskite material, semiconductor devices including the capacitors, and methods of manufacturing the capacitors according to embodiments will be described in detail with reference to the accompanying drawings. In the following drawings, the same reference numerals refer to the same components, and the size or thickness of each component may be exaggerated for clarity and convenience.

Hereinafter, what is described as "on" or "over" may include not only that which is directly above in contact, but also that which is above in a non-contact manner. As used herein, the singular forms "a", "an" and "the" are intended to include the plural forms as well, unless the context clearly indicates otherwise. When a part is said to "include" a component, this means that other components may be further included instead of excluding other components, unless otherwise stated.

The use of the term "above-described" and similar indication terms may correspond to both singular and plural. Unless explicitly stated or contrary to steps constituting a method, the steps may be performed in a suitable order. It is not necessarily limited to the order of description of the above steps.

Although the terms "first", "second", etc., may be used herein to describe various elements, components, regions, and/or layers, these elements, components, regions, and/or layers should not be limited by these terms. These terms are used only to distinguish one component from another, not for purposes of limitation. Capacitors each including a perovskite material, semiconductor devices including the capacitors, and methods of manufacturing the capacitors can be implemented in various different forms and are not limited to the embodiments described herein.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

"Perovskite" refers to a compound in which, in a unit cell, a first cation is located at (0,0,0), a second cation is located at (½,½,½), and an anion is located at (½,½,0). It may be understood that perovskite not only has the ideal symmetrical structure of calcium titanate ($CaTiO_3$), but also has a warped structure with lower symmetry.

As the demand for higher integration of semiconductor devices has been increasing, capacitors with improved properties for use in semiconductor devices such as semiconductor memory devices are required. For example, there is an increasing demand for a capacitor having high capacitance even at a small nanoscale size. The capacitance is proportional to the dielectric constant of a dielectric layer included in the capacitor. Accordingly, studies on a dielectric layer having a perovskite structure having a high dielectric constant are actively being conducted.

Meanwhile, the dielectric constant of the dielectric layer and the leakage current density of the capacitor have a trade-off relationship. Accordingly, in order to implement a capacitor having a high dielectric constant and a low leakage current, a method of manufacturing a capacitor in which a dielectric layer having a high dielectric constant and low bandgap energy and a dielectric layer having a low dielectric constant and high bandgap energy are stacked may be beneficial. However, when a dielectric layer having a high dielectric constant and a dielectric layer having a low dielectric constant are stacked, the stacked structure may act as a series capacitor, and thus, the dielectric constant of the capacitor may decrease. In addition, when a dielectric layer having a perovskite structure is between an upper electrode and a lower electrode, which include a metal such as platinum (Pt), the crystallinity of the capacitor may be degraded due to a lattice mismatch between the electrodes and the dielectric layer. The degraded crystallinity may consequently reduce the dielectric constant of the capacitor. Hereinafter, a capacitor, which has a high dielectric constant and a low leakage current density and has a crystallinity that is not degraded by reducing a lattice mismatch between an electrode and a dielectric layer, is described in detail according to various example embodiments.

Figure 1:
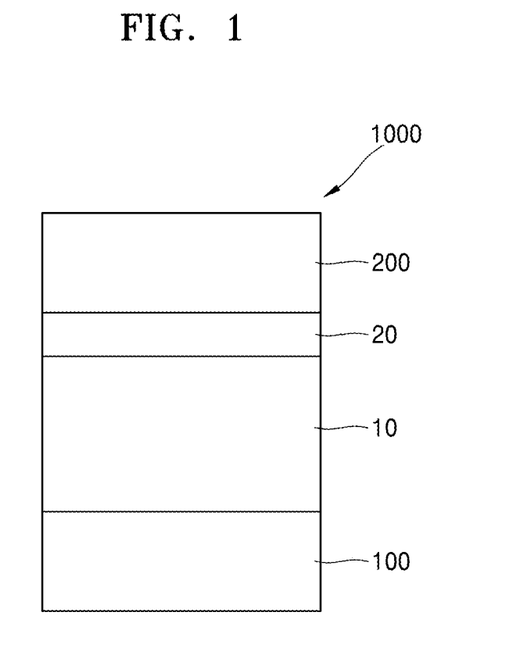
FIG. 1 is a schematic diagram illustrating the structure of a capacitor according to an example embodiment.
Figure 2:
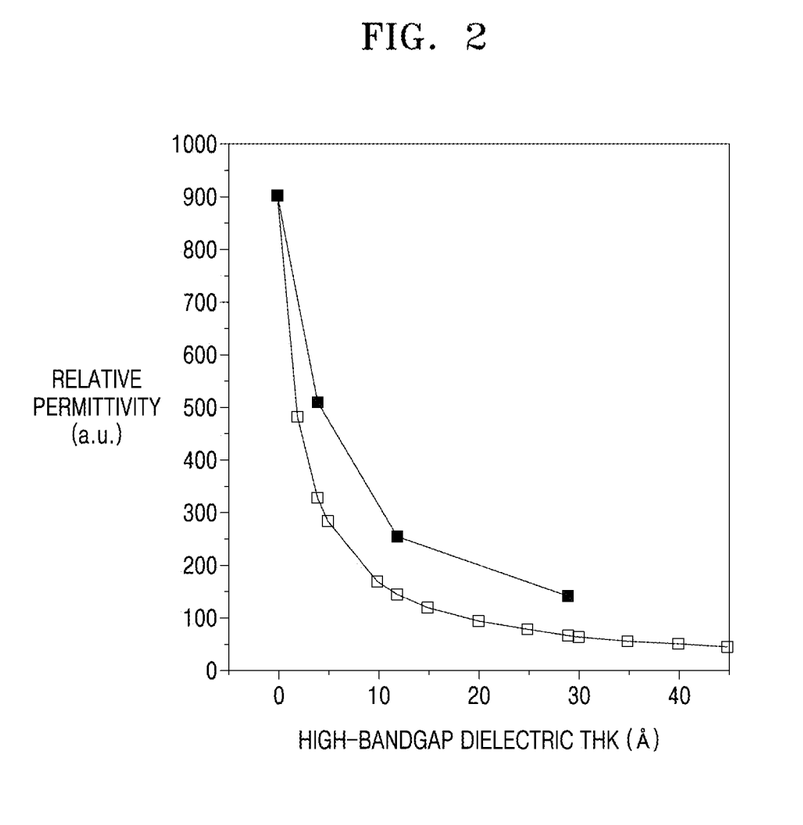
FIG. 2 is a graph briefly showing a change in a dielectric constant according to the thickness of a second dielectric layer of the capacitor of FIG. 1.
Figure 3:
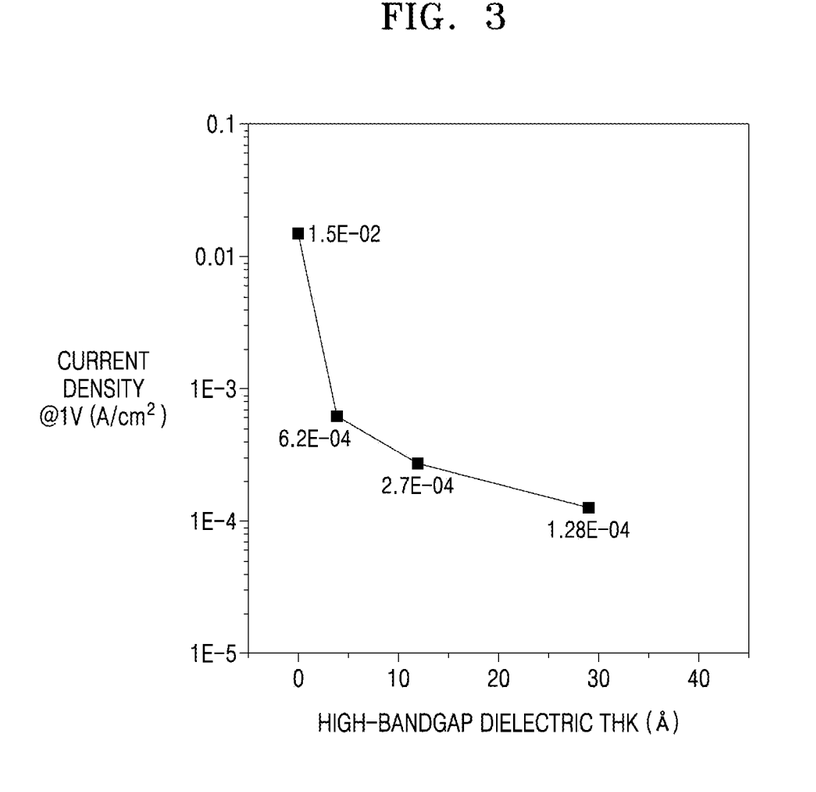
FIG. 3 is a graph briefly showing a change in a leakage current according to the thickness of the second dielectric layer of the capacitor of FIG. 1.

FIG. 1 is a schematic diagram illustrating the structure of a capacitor 1000 according to an example embodiment. FIG. 2 is a graph briefly showing a change in dielectric constant according to the thickness of a second dielectric layer 20 of the capacitor 1000 of FIG. 1. FIG. 3 is a graph briefly showing a change in leakage current according to the thickness of the second dielectric layer 20 of the capacitor 1000 of FIG. 1.

Referring to FIG. 1, the capacitor 1000 may include a lower electrode 100, a first dielectric layer 10 on the lower electrode 100, a second dielectric layer 20 on the first dielectric layer 10, and an upper electrode 200 on the second dielectric layer 20. For example, the capacitor 1000 may include a metal insulator metal (MIM) capacitor. In the capacitor 1000, the second dielectric layer 20 may have a band gap energy greater than that of the first dielectric layer 10.

The lower electrode 100 may include a conductive material having a perovskite structure. For example, the lower electrode 100 may include a strontium based oxide, for example one of SRO, SIO, SVO, SNO, SCO, and SMO. SRO may represent a strontium ruthenium oxide like $SrRuO_3$. SIO may represent a strontium iridium oxide like $SrIrO_3$. SVO may represent a strontium vanadium oxide like $SrVO_3$. SNO may represent a strontium niobium oxide like $SrNbO_3$. SCO may represent a strontium cobalt oxide like $SrCoO_3$. SMO may represent a strontium molybdenum oxide like $SrMoO_3$. For example, when the lower electrode 100 includes $SrRuO_3$, the bulk lattice constant of the lower electrode 100 may be about 3.93 Å. In an example embodiment, the thickness of the lower electrode 100 may be about 300 Å. However, the disclosure is not limited thereto, and the thickness of the lower electrode 100 may be, for example, 300 Å or less.

The first dielectric layer 10 may have a perovskite structure, and may include a high-k material having a high dielectric constant. For example, the first dielectric layer 10 may include a dielectric material including at least one of strontium (Sr), barium (Ba), and/or titanium (Ti). For example, the first dielectric layer 10 may include one of STO, BTO, and BSTO. STO may represent a strontium titanium oxide like $SrTiO_3$. BTO may represent a barium titanium oxide like $BaTiO_3$. BSTO may represent a barium strontium titanium oxide like $(Ba, Sr)TiO_3$. $(Ba, Sr)TiO3$ may have a structure formed by distributing Ba and Sr at a certain ratio in a unit cell. For example, $(Ba, Sr)TiO3$ may have a structure formed by distributing Ba and Sr at a 1:1 ratio in a unit cell. For example, when the first dielectric layer 10 includes (Ba, Sr) TiO3, the bulk lattice constant of the first dielectric layer 10 may be about 3.95 Å. Since the first dielectric layer 10 includes one of STO, BTO, and BSTO, the first dielectric layer 10 may have a relatively higher dielectric constant than the second dielectric layer 20.

The second dielectric layer 20 may have a perovskite structure. For example, the second dielectric layer 20 may include a dielectric material including at least one of Sr and/or hafnium (Hf). For example, the second dielectric layer 20 may include one of SHO, SZO, or a mixture thereof. SHO may represent a strontium hafnium oxide like $SrHfO_3$, and SZO may represent a strontium zirconium oxide like $SrZrO_3$. For example, the second dielectric layer 20 may have a structure formed by distributing SHO and/or SZO at a certain ratio. For example, the second dielectric layer 20 may have a structure formed by distributing SHO and SZO at a 1:1 ratio. However, the disclosure is not limited thereto, and the second dielectric layer 20 may have a structure in which SHO and/or SZO are distributed at various ratios. When the second dielectric layer 20 includes $SrHfO_3$, the bulk lattice constant of the second dielectric layer 20 may be about 4.07 Å. Since the second dielectric layer 20 includes SHO, SZO, or a mixture thereof, the second dielectric layer 20 may have a relatively higher band gap energy than the first dielectric layer 10. Accordingly, the second dielectric layer 20 may be referred to as a high-bandgap dielectric layer.

The capacitor 1000 includes the first dielectric layer 10 having a relatively high dielectric constant and the second dielectric layer 20 having a relatively high bandgap energy, thereby simultaneously securing a high dielectric constant and a low leakage current density.

The total thickness of the first dielectric layer 10 and the second dielectric layer 20 may be about 30 nm to about 200 nm. The ratio of the thickness of the first dielectric layer 10 to the total thickness of the first dielectric layer 10 and the second dielectric layer 20 may be about 70% or more. The ratio of the thickness of the second dielectric layer 20 to the total thickness of the first dielectric layer 10 and the second dielectric layer 20 may be about 30% or less. For example, in the case wherein the sum of the thickness of the first dielectric layer 10 and the thickness of the second dielectric layer 20 may be about 100 nm, the thickness of the first dielectric layer 10 may be greater than or equal to 70 nm and less than 100 nm. Furthermore, the thickness of the second dielectric layer 20 may be greater than 0 nm and less than or equal to 30 nm.

The upper electrode 200 may include a conductive material having a perovskite structure. For example, the upper electrode 200 may include one of SRO, SIO, SVO, SNO, SCO, and SMO. SRO may include $SrRuO_3$. SRO may represent a strontium ruthenium oxide like $SrRuO_3$. SIO may represent a strontium iridium oxide like $SrIrO_3$. SVO may represent a strontium vanadium oxide like $SrVO_3$. SNO may represent a strontium niobium oxide like $SrNbO_3$. SCO may represent a strontium cobalt oxide like $SrCoO_3$. SMO may represent a strontium molybdenum oxide like $SrMoO_3$. For example, when the upper electrode 200 includes $SrRuO_3$, the bulk lattice constant of the upper electrode 200 may be about 3.93 Å. In an example embodiment, the thickness of the upper electrode 200 may be about 50 Å. However, the disclosure is not limited thereto, and the thickness of the upper electrode 200 may be 50 Å or less.

Furthermore, the degree of lattice mismatch between the lower electrode 100 and the first dielectric layer 10 may be 5% or less. For example, when the lattice constant of the lower electrode 100 is 3.93 Å and the lattice constant of the first dielectric layer 10 is 3.95 Å, the degree of lattice mismatch between the lower electrode 100 and the first dielectric layer 10 may be about 0.5%. In addition, the degree of lattice mismatch between the lower electrode 100 and the second dielectric layer 20 may be 5% or less. For example, when the lattice constant of the lower electrode 100 is 3.93 Å and the lattice constant of the second dielectric layer 20 is 4.07 Å, the degree of lattice mismatch between the lower electrode 100 and the second dielectric layer 20 may be about 3.5%. As such, since the lattice mismatch between the lower electrode 100 and the first dielectric layer 10 and the lattice mismatch between the lower electrode 100 and the second dielectric layer 20 are kept as low as 5% or less, crystallinity of the capacitor 1000 may be maintained. As a result, since the first dielectric layer 10 having a relatively high dielectric constant and the second dielectric layer 20 having a relatively high bandgap energy are formed on the lower electrode 100 having a perovskite structure, the capacitor 1000 may have a low leakage current density and stable crystallinity, thereby suppressing and/or preventing a decrease in the dielectric constant.

Referring to FIG. 2, as the thickness (horizontal axis) of the second dielectric layer 20 increases, the dielectric constant, represented by the relative permittivity (vertical axis) of the capacitor 1000 may decrease. As illustrated, a dielectric constant obtained by simply summing the intrinsic dielectric constant of the first dielectric layer 10 and the intrinsic dielectric constant of the second dielectric layer 20 (lower solid line) may be less than the dielectric constant of the capacitor 1000 (upper solid line) having stable crystallinity obtained by forming the first dielectric layer 10 and the second dielectric layer 20 between the lower electrode 100 and the upper electrode 200 each having a perovskite structure. For example, when the thickness of the second dielectric layer 20 is about 30 Å, the dielectric constant (upper solid line) of the capacitor 1000 having stable crystallinity obtained by forming the first dielectric layer 10 and the second dielectric layer 20 between the lower electrode 100 and the upper electrode 200, each having a perovskite structure, may be about 1.5 times greater than the dielectric constant (lower solid line) obtained by simply summing the intrinsic dielectric constants of the first dielectric layer 10 and the second dielectric layer 20. When the first dielectric layer 10 having a relatively high dielectric constant and the second dielectric layer 20 having a relatively low dielectric constant are stacked between electrodes not having a perovskite structure, the stacked structure may act as a series capacitor, and thus, the dielectric constant of the capacitor may decrease. However, by forming the first dielectric layer 10 and the second dielectric layer 20 between the lower electrode 100 and the upper electrode 200, each having a perovskite structure, the crystallinity of the capacitor 1000 may be improved and/or maintained, and thus, a decrease in the dielectric constant of the capacitor 1000 due to the series capacitor action of the first dielectric layer 10 and the second dielectric layer 20 may be suppressed and/or prevented. This is because the lower electrode 100 and the upper electrode 200 and the first dielectric layer 10 and the second dielectric layer 20 have similar lattice constants, thereby reducing lattice mismatch between them and thus the crystallinity of the capacitor 1000 is improved and/or maintained. Additionally, when the thickness of the second dielectric layer 20 is thicker than necessary, the dielectric constant of the capacitor 1000 may be excessively reduced. For example, when the ratio of the thickness of the second dielectric layer 20 to the total thickness of the first dielectric layer 10 and the second dielectric layer 20 is greater than 30%, the crystallinity of the capacitor 1000 may be degraded as there may be a fine lattice mismatch between the first dielectric layer 10 and the second dielectric layer 20 and/or between the upper electrode 200 and the second dielectric layer 20. As the thickness of the second dielectric layer 20 increases, the degree of lattice mismatch between the first dielectric layer 10 and the second dielectric layer 20 or between the upper electrode 200 and the second dielectric layer 20 increases. Accordingly, the crystallinity of the capacitor 1000 may degrade due to increased lattice mismatch between the first dielectric layer 10 and the second dielectric layer 20 and/or between the upper electrode 200 and the second dielectric layer 20. As such, when the thickness of the second dielectric layer 20 is too thick, the crystallinity of the capacitor 1000 may be degraded.

Referring to FIG. 3, as the thickness (horizontal axis) of the second dielectric layer 20 increases, the leakage current density (vertical axis) of the capacitor 1000 may decrease. For example, in the case where a voltage of ±1 volts (V) is applied to the capacitor 1000, when the thickness of the second dielectric layer 20 is about 10 Å, the leakage current density may be about 2.7E-4 A/cm$^2$, and when the thickness of the second dielectric layer 20 is about 30 Å, the leakage current density may be about 1.28E-4 A/cm$^2$. As described above, as the thickness of the second dielectric layer 20 having a band gap energy relatively higher than that of the first dielectric layer 10 increases, the leakage current density of the capacitor 1000 may decrease.

Figure 4:
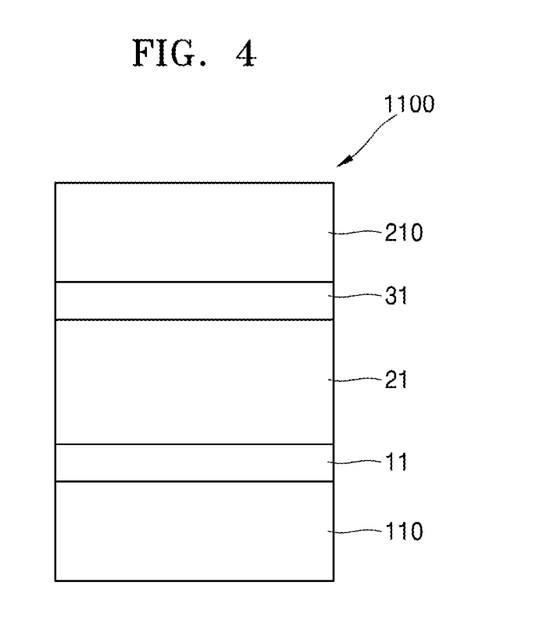
FIG. 4 is a schematic diagram illustrating the structure of a capacitor according to another example embodiment.

FIG. 4 is a schematic diagram illustrating the structure of a capacitor 1100 according to another example embodiment. The capacitor 1100 may be substantially the same as the capacitor 1000 of FIG. 1 except that the capacitor 1100 further includes a third dielectric layer 11. In describing FIG. 4, descriptions that overlap with those of FIG. 1 will be omitted.

Referring to FIG. 4, the capacitor 1100 may include a lower electrode 110, a first dielectric layer 21 on the lower electrode 110, a second dielectric layer 31, having a band gap energy greater than that of the first dielectric layer 21, on the first dielectric layer 21, and an upper electrode 210 on the second dielectric layer 31. For example, the capacitor 1100 may include an MIM capacitor. The capacitor 1100 may further include a third dielectric layer 11, having a band gap energy greater than that of the first dielectric layer 21, between the first dielectric layer 21 and the lower electrode 110.

The lower electrode 110 and the upper electrode 210 may be substantially the same as the lower electrode 100 and the upper electrode 200 of FIG. 1. For example, each of the lower electrode 110 and the upper electrode 210 may include a conductive material having a perovskite structure. For example, each of the lower electrode 110 and the upper electrode 210 may include one of SRO, SIO, SVO, SNO, SCO, and SMO.

The first dielectric layer 21 may be substantially the same as the first dielectric layer 10 of FIG. 1. For example, the first dielectric layer 21 may have a perovskite structure. For example, the first dielectric layer 21 may include one of STO, BTO, and BSTO. Since the first dielectric layer 21 includes one of STO, BTO, and BSTO, the first dielectric layer 21 may have a relatively higher dielectric constant than the second dielectric layer 31 and the third dielectric layer 11.

The second dielectric layer 31 may be substantially the same as the second dielectric layer 20 of FIG. 1. For example, the second dielectric layer 31 may have a perovskite structure. For example, the second dielectric layer 31 may include one of SHO, SZO, or a mixture thereof. Since the second dielectric layer 31 includes one of SHO, SZO, or a mixture thereof, the second dielectric layer 31 may have a relatively higher band gap energy than the first dielectric layer 21.

The third dielectric layer 11 may be substantially the same as the second dielectric layer 31. For example, the third dielectric layer 11 may have a perovskite structure. For example, the third dielectric layer 11 may include one of SHO, SZO, or a mixture thereof. Since the third dielectric layer 11 includes one of SHO, SZO, or a mixture thereof, the third dielectric layer 11 may have a relatively higher bandgap energy than the first dielectric layer 21.

As such, the capacitor 1100 has a structure in which the first dielectric layer 21 having a relatively high dielectric constant is arranged between the second dielectric layer 31 and the third dielectric layer 11, each having a relatively high bandgap energy. Thus, the capacitor 1100 may have a lower leakage current density compared to the capacitor 1000 of FIG. 1.

The total thickness of the first dielectric layer 21, the second dielectric layer 31, and the third dielectric layer 11 may be about 30 nm to about 200 nm. The ratio of the thickness of the first dielectric layer 21 to the total thickness of the first dielectric layer 21, the second dielectric layer 31, and the third dielectric layer 11 may be about 70% or more. The ratio of the sum of the thicknesses of the second dielectric layer 31 and the third dielectric layer 11 to the total thickness of the first dielectric layer 21, the second dielectric layer 31, and the third dielectric layer 11 may be about 30% or less. For example, in an example embodiment wherein the sum of the thicknesses of the first dielectric layer 21, the second dielectric layer 31, and the third dielectric layer 11 may be about 100 nm, the thickness of the first dielectric layer 21 may be greater than or equal to 70 nm and less than 100 nm. In addition, the sum of the thicknesses of the second dielectric layer 31 and the third dielectric layer 11 may be greater than 0 nm and less than or equal to 30 nm.

When the ratio of the sum of the thicknesses of the second dielectric layer 31 and the third dielectric layer 11 to the total thickness of the first dielectric layer 21, the second dielectric layer 31, and the third dielectric layer 11 is greater than 30%, the crystallinity of the capacitor 1100 may be degraded.

Since each of the second dielectric layer 31 and the third dielectric layer 11 has a relatively high bandgap energy, each of the second dielectric layer 31 and the third dielectric layer 11 may have a fine lattice mismatch with respect to an adjacent layer (the first dielectric layer 21, the lower electrode 110, and/or the upper electrode 200). However, as the thicknesses of the second dielectric layer 31 and the third dielectric layer 11 increase, a lattice mismatch with the adjacent layer (e.g., the first dielectric layer 21, the lower electrode 110, and/or the upper electrode 210) further increases, and thus, the crystallinity of the capacitor 1100 may be reduced.

The capacitor 1100 includes the first dielectric layer 21 having a relatively high dielectric constant and the second dielectric layer 31 and the third dielectric layer 11 each having a relatively high bandgap energy, thereby simultaneously securing a high dielectric constant and a low leakage current density.

Figure 5:
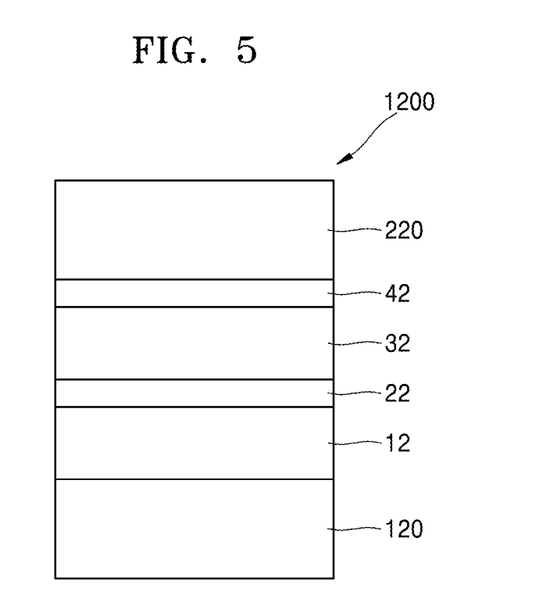
FIG. 5 is a schematic diagram illustrating the structure of a capacitor according to another example embodiment.

Furthermore, a lattice mismatch between the lower electrode 110, the upper electrode 210, and the adjacent dielectric layers (e.g., the first dielectric layer 21, the second dielectric layer 31, and the third dielectric layer 11) may be about 5% or less. Accordingly, the crystallinity of the capacitor 1100 may be maintained. As a result, since the first dielectric layer 21 having a relatively high dielectric constant and the second dielectric layer 31 and the third dielectric layer 11 each having a relatively high bandgap energy are on the lower electrode 110 having a perovskite structure, the capacitor 1100 may have a low leakage current density and stable crystallinity, thereby suppressing and/or preventing a decrease in the dielectric constant. FIG. 5 is a schematic diagram illustrating the structure of a capacitor 1200 according to another example embodiment. The capacitor 1200 may be substantially the same as the capacitor 1000 of FIG. 1 except that the capacitor 1200 includes a plurality of first dielectric layers 12 and 32 and a plurality of second dielectric layers 22 and 42. In describing FIG. 5, descriptions that overlap with those of FIG. 1 will be omitted.

Referring to FIG. 5, the capacitor 200 may include a lower electrode 120, the plurality of first dielectric layers 12 and 32 on the lower electrode 120, the plurality of second dielectric layers 22 and 42, having band gap energies greater than those of the first dielectric layers 12 and 32, on the plurality of first dielectric layers 12 and 32, and an upper electrode 220 on the plurality of second dielectric layers 22 and 42. For example, the capacitor 1000 may include an MIM capacitor. Furthermore, the plurality of first dielectric layers 12 and 32 and the plurality of second dielectric layers 22 and 42 may be alternately stacked on each other. For example, the capacitor 1200 may include two first dielectric layers 12 and 32 and two second dielectric layers 22 and 42. For example, the capacitor 1200 may have a structure formed by sequentially stacking the first dielectric layer 12, the second dielectric layer 22, the first dielectric layer 32, and the second dielectric layer 42. However, the disclosure is not limited thereto, and the capacitor 1200 may have a structure in which three or more first dielectric layers 12 and 32 and/or three or more second dielectric layers 22 and 42 are alternately stacked.

The lower electrode 120 and the upper electrode 220 may be substantially the same as the lower electrode 100 and the upper electrode 200 of FIG. 1, respectively. For example, the lower electrode 120 and the upper electrode 220 may each include a conductive material having a perovskite structure. For example, the lower electrode 120 and the upper electrode 220 may each include one of SRO, SIO, SVO, SNO, SCO, and SMO.

Each of the plurality of first dielectric layers 12 and 32 may be substantially the same as the first dielectric layer 10 of FIG. 1. For example, each of the plurality of first dielectric layers 12 and 32 may have a perovskite structure and/or may include one of STO, BTO, and BSTO. Since each of the plurality of first dielectric layers 12 and 32 includes one of STO, BTO, and BSTO, each of the plurality of first dielectric layers 12 and 32 may have a relatively higher dielectric constant than the plurality of second dielectric layers 22 and 42.

Each of the plurality of second dielectric layers 22 and 42 may be substantially the same as the second dielectric layer 20 of FIG. 1. For example, each of the plurality of second dielectric layers 22 and 42 may have a perovskite structure and/or may include one of SHO, SZO, or a mixture thereof. Since each of the plurality of second dielectric layers 22 and 42 includes one of SHO, SZO, or a mixture thereof, each of the plurality of second dielectric layers 22 and 42 may have a relatively higher band gap energy than the plurality of first dielectric layers 12 and 32.

As described above, the capacitor 1100 has a structure formed by alternately stacking the plurality of first dielectric layers 12 and 32 and the plurality of second dielectric layers 22 and 42, and thus may have a lower leakage current density compared to the capacitor 1000 of FIG. 1.

The total thickness of the plurality of first dielectric layers 12 and 32 and the plurality of second dielectric layers 22 and 42 may be about 30 nm to about 200 nm. The ratio of the sum of the thicknesses of the plurality of first dielectric layers 12 and 32 to the total thickness of the plurality of first dielectric layers 12 and 32 and the plurality of second dielectric layers 22 and 42 may be about 70% or more. The ratio of the sum of the thicknesses of the plurality of second dielectric layers 22 and 42 to the total thickness of the plurality of first dielectric layers 12 and 32 and the plurality of second dielectric layers 22 and 42 may be about 30% or less. For example, in an example embodiment wherein the sum of the thicknesses of the plurality of first dielectric layers 12 and 32 and the plurality of second dielectric layers 22 and 42 may be about 100 nm, the sum of the thicknesses of the plurality of first dielectric layers 12 and 32 may be greater than or equal to 70 nm and less than 100 nm. In addition, the sum of the thicknesses of the plurality of second dielectric layers 22 and 42 may be greater than 0 nm and less than or equal to 30 nm.

In the capacitor 1200 when the ratio of the sum of the thicknesses of the plurality of second dielectric layers 22 and 42 to the total thickness of the plurality of first dielectric layers 12 and 32 and the plurality of second dielectric layers 22 and 42 is greater than 30%, the crystallinity of the capacitor 1200 may be degraded. Since each of the plurality of second dielectric layers 22 and 42 has a relatively high bandgap energy, each of the plurality of second dielectric layers 22 and 42 may have a fine lattice mismatch with respect to an adjacent layer (the plurality of first dielectric layers 12 and 32, the lower electrode 120 and/or the upper electrode 220). However, as the thicknesses of the plurality of second dielectric layers 22 and 42 increase, a lattice mismatch with a layer (the plurality of first dielectric layers 12 and 32 or the upper electrode 210) adjacent to the plurality of second dielectric layers 22 and 42 further increases, and thus, the crystallinity of the capacitor 1200 may be reduced.

The capacitor 1200 includes the plurality of first dielectric layers 12 and 32, each having a relatively high dielectric constant, and the plurality of second dielectric layers 22 and 42, each having a relatively high bandgap energy, thereby simultaneously securing a high dielectric constant and a low leakage current density.

Furthermore, a lattice mismatch between the lower electrode 120, the upper electrode 220, and the adjacent dielectric layers (e.g., the plurality of first dielectric layers 12 and 32 and the plurality of second dielectric layers 22 and 42) may be 5% or less. Accordingly, the crystallinity of the capacitor 1200 may be maintained. As a result, since the plurality of first dielectric layers 12 and 32 each having a relatively high dielectric constant and the plurality of second dielectric layers 22 and 42 each having a relatively high bandgap energy are formed on the lower electrode 120 having a perovskite structure, the capacitor 1200 may have a low leakage current density and stable crystallinity, thereby suppressing a decrease in dielectric constant.

Figure 6:
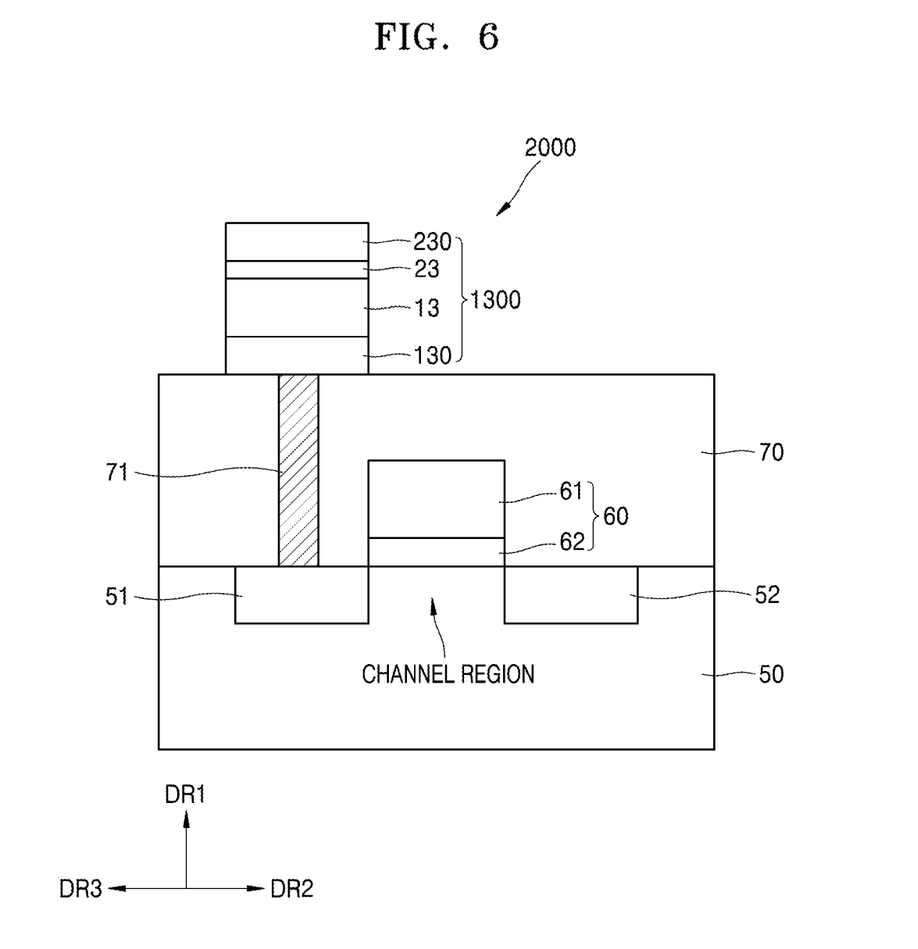
FIG. 6 is a schematic diagram illustrating the structure of a semiconductor device according to an example embodiment.

FIG. 6 is a schematic diagram illustrating the structure of a semiconductor device 2000 according to an example embodiment.

Referring to FIG. 6, the semiconductor device 2000 may include a transistor and a capacitor 1300 connected thereto. The semiconductor device 2000 may include a first source/drain region 51 and a second source/drain region 52, a gate structure 60, an interlayer insulating layer 70, a contact 71, and the capacitor 1300.

The first source/drain region 51 and the second source/drain region 52 may be on a substrate 50. The first and second source/drain regions 51 and 52 may be spaced apart from each other in a second direction DR2 and/or a third direction DR3, which are parallel to the upper surface of the substrate 50. For example, the first and second source/drain regions 51 and 52 may be spaced apart from each other with a channel region therebetween. The first and second source/drain regions 51 and 52 may be formed, for example, by implanting impurities into the substrate 50.

The gate structure 60 may be on the substrate 50. The gate structure 60 may be between the first and second source/drain regions 51 and 52 and/or on the channel region. The gate structure 60 may include a gate electrode 61 and a gate insulating layer 62. The gate electrode 61 may include a conductive material. For example, the gate electrode 61 may include metal, a doped semiconductor, and/or polysilicon. However, the disclosure is not limited thereto, and the gate electrode 61 may include a conductive material other than metal, semiconductor, and/or polysilicon.

The gate insulating layer 62 may be between the gate electrode 61 and the substrate 50. The gate insulating layer 62 may electrically disconnect the substrate 50 from the gate electrode 61. The gate insulating layer 62 may include an insulating material. For example, the gate insulating layer 62 may include silicon oxide (e.g., $SiO_2$) and/or aluminum oxide (e.g., $Al_2O_3$).

The interlayer insulating layer 70 may be on the substrate 50 and may cover the gate structure 60. The interlayer insulating layer 70 may include an insulating material. For example, the interlayer insulating layer 70 may include silicon oxide (e.g., $SiO_2$) and/or aluminum oxide (e.g., $Al_2O_3$).

The capacitor 1300 may be on the interlayer insulating layer 70. The capacitor 1300 may be substantially the same as the capacitor 1000 of FIG. 1. For example, the capacitor 1300 may include a lower electrode 130, a first dielectric layer 13 on the lower electrode 130, a second dielectric layer 23, having a band gap energy greater than that of the first dielectric layer 13, on the first dielectric layer 13, and an upper electrode 230 provided on the second dielectric layer 23. In this case, the lower electrode 130 and the upper electrode 230 may each have a perovskite structure. However, the disclosure is not limited thereto, and the capacitor 1300 may be, for example, substantially the same as the capacitor 1100 of FIG. 4 and/or the capacitor 1200 of FIG. 5.

The contact 71 may be between the lower electrode 130 and the first source/drain region 51. The contact 71 may penetrate the interlayer insulating layer 70 and/or may electrically connect the lower electrode 130 and the first source/drain regions 51. The contact 71 may include a conductive material (e.g., metal).

Figure 7:
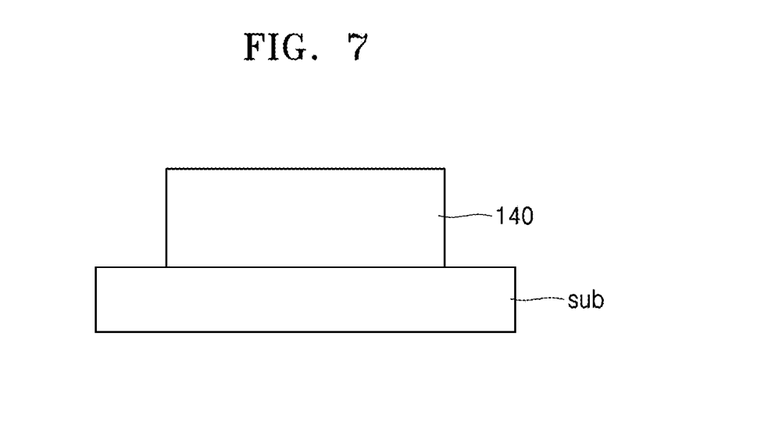
FIG. 7 is a schematic diagram illustrating a method of forming a lower electrode, according to a method of manufacturing a capacitor according to an example embodiment.
Figure 8:
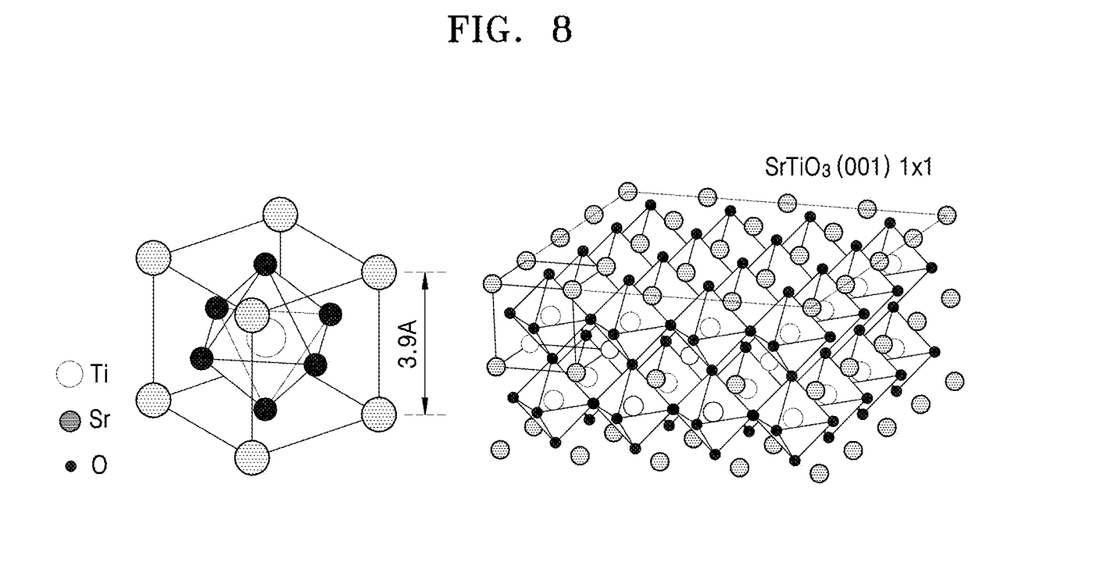
FIG. 8 is a schematic diagram illustrating the structure of a material included in a substrate of FIG. 7.
Figure 9:
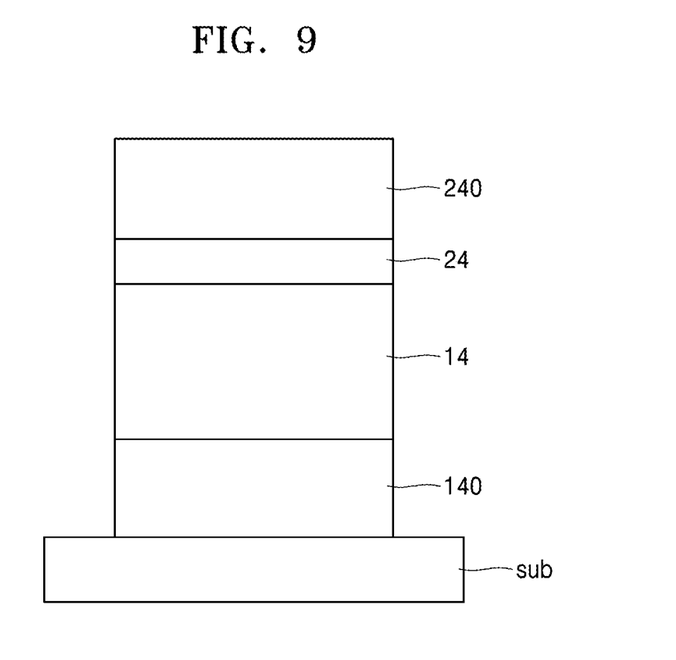
FIG. 9 is a schematic diagram illustrating a method of forming a first dielectric layer, a second dielectric layer, and an upper electrode on a lower electrode, according to a method of manufacturing a capacitor according to an example embodiment.

FIG. 7 is a schematic diagram illustrating a method of forming a lower electrode 140, according to a method of manufacturing a capacitor according to an example embodiment. FIG. 8 is a schematic diagram illustrating the structure of a material included in a substrate sub of FIG. 7. FIG. 9 is a schematic diagram illustrating a method of forming a first dielectric layer, a second dielectric layer, and an upper electrode on a lower electrode, according to a method of manufacturing a capacitor according to an example embodiment.

Referring to FIG. 7, a method of manufacturing a capacitor according to an example embodiment may include forming a lower electrode 140 having a perovskite structure, for example on a substrate sub. For example, the lower electrode 140 may be formed on the substrate sub through a pulsed laser deposition (PLD) process. However, the disclosure is not limited thereto, and the lower electrode 140 may be formed on the substrate sub through one of sputtering and molecular beam epitaxy (MBE).

The lower electrode 140 may include a material having a perovskite structure. The substrate sub may have a lattice misfit of 5% or less with respect to the lower electrode 140. Accordingly, the lower electrode 140 may be formed by epitaxially growing on the substrate sub. For example, the lattice constant of the substrate sub may be in the range of about 3.85 Å to about 3.95 Å. For example, the substrate 40 may include one of $SrTiO_3$ and/or Nb-doped $SrTiO_3$. The structure of $SrTiO_3$ may have a structure as shown in FIG. 8, and the substrate sub having this structure may have a lattice misfit of 5% or less with respect to the lower electrode 140 having a perovskite structure.

Referring to FIG. 9, a method of manufacturing a capacitor according to an example embodiment may include subsequently forming a first dielectric layer 14, which has a first dielectric constant and a first band gap energy, on a lower electrode 140, forming a second dielectric layer 24, which has a second dielectric constant less than the first dielectric constant and a second band gap energy greater than the first band gap energy, on the first dielectric layer 14, and forming an upper electrode 240, which has a perovskite structure, on the second dielectric layer 24.

For example, after the lower electrode 140 is formed on the substrate sub, the first dielectric layer 14, the second dielectric layer 24, and the upper electrode 240 may be sequentially formed on the lower electrode 140. In an example embodiment, the first dielectric layer 14, the second dielectric layer 24, and the upper electrode 240 may be sequentially formed on the lower electrode 140 through a PLD process. However, the disclosure is not limited thereto, and the first dielectric layer 14, the second dielectric layer 24, and the upper electrode 240 may be sequentially formed on the lower electrode 140, for example, through one of sputtering and MBE.

In the forming of the first dielectric layer 14, the first dielectric layer 14 may be formed using a target material in which Sr and Ba are mixed at a 1:1 ratio. Furthermore, the target material may also include Ti. The deposition of the target material of the first dielectric layer 14 may be deposited in the presence of oxygen, for example in the presence of ambient air and/or through an oxygen. Accordingly, the first dielectric layer 14 may include BSTO in which Sr and Ba are mixed at a 1:1 ratio.

In the forming of the second dielectric layer 24, the second dielectric layer 24 may be formed using a target material in which Sr, Hf, and zirconium Zr are mixed. However, the disclosure is not limited thereto, and the second dielectric layer 24 may be formed using a target material in which Sr and Zr are mixed and/or a target material in which Sr and Hf are mixed. The deposition of the target material of the second dielectric layer 24 may be deposited in the presence of oxygen, for example in the presence of ambient air and/or through an oxygen. Accordingly, the second dielectric layer 24 may include one of SHO, SZO, or a mixture thereof.

According to one or more embodiments of the present disclosure, there may be provided capacitors in which a decrease in dielectric constant is suppressed and which has a low leakage current density, thereby having an improved charging capacity.

It should be understood that the example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:
   a lower electrode including a perovskite structure;
   an upper electrode including a perovskite structure;
   a first dielectric layer, including a perovskite structure, between the lower electrode and the upper electrode; and
   a second dielectric layer, including a perovskite structure and having a band gap energy greater than that of the first dielectric layer, between the first dielectric layer and the upper electrode,
   wherein a degree of a lattice mismatch between the lower electrode and the first dielectric layer is about 5% or less and a degree of a lattice mismatch between the lower electrode and the second dielectric layer is about 5% or less,
   wherein a ratio of a thickness of the first dielectric layer to a total thickness of the first dielectric layer and the second dielectric layer is about 70% or more,
   wherein a ratio of a thickness of the second dielectric layer to the total thickness of the first dielectric layer and the second dielectric layer is about 30% or less, and
   wherein the degree of lattice mismatch between the lower electrode and the first dielectric layer is less than the degree of lattice mismatch between the lower electrode and the second dielectric layer.

2. The capacitor of claim 1, wherein the lower electrode and the upper electrode, each, includes at least one of SrRuO3, SrMoO3, SrIrO3, SrVO3, SrNbO3, or SrCoO3.

3. The capacitor of claim 1, wherein the first dielectric layer includes at least one of STO, BTO, or BSTO.

4. The capacitor of claim 3, wherein the first dielectric layer includes at least one of SrTiO3, BaTiO3, or (Ba, Sr)TiO3.

5. The capacitor of claim 1, wherein the second dielectric layer includes at least one of SZO or SHO.

6. The capacitor of claim 5, wherein the second dielectric layer includes at least one of SrZrO3, or SrHfO3.

7. The capacitor of claim 1, further comprising:
a third dielectric layer between the first dielectric layer and the lower electrode, the third dielectric layer having a band gap energy greater than that of the first dielectric layer.

8. The capacitor of claim 7, wherein a degree of a lattice mismatch between the lower electrode and the third dielectric layer is about 5% or less.

9. The capacitor of claim 1, wherein the first dielectric layer is one of a plurality of first dielectric layers, and the second dielectric layer is one of a plurality of second dielectric layers,
wherein the plurality of first dielectric layers and the plurality of second dielectric layers are alternately stacked on each other.

10. The capacitor of claim 9, wherein the plurality of first dielectric layers include two first dielectric layers, and the plurality of second dielectric layers include two second dielectric layers.

11. The capacitor of claim 1, wherein the total thickness of the first dielectric layer and the second dielectric layer is about 30 nm to about 200 nm.

12. The capacitor of claim 1, wherein a thickness of the first dielectric layer is greater than or equal to about 70 nm and less than about 100 nm.

13. The dielectric layer of claim 1, wherein a thickness of the second dielectric layer is greater than 0 nm and less than or equal to about 30 nm.

14. A semiconductor device comprising:
a transistor; and
a capacitor connected to the transistor, the capacitor including
a lower electrode including a perovskite structure,
an upper electrode including a perovskite structure,
a first dielectric layer, including a perovskite structure, between the lower electrode and the upper electrode, and
a second dielectric layer, including a perovskite structure, having a band gap energy greater than that of the first dielectric layer, between the first dielectric layer and the upper electrode,
wherein a degree of a lattice mismatch between the lower electrode and the first dielectric layer is about 5% or less and a degree of a lattice mismatch between the lower electrode and the second dielectric layer is about 5% or less,
wherein a ratio of a thickness of the first dielectric layer to a total thickness of the first dielectric layer and the second dielectric layer is about 70% or more,
wherein a ratio of a thickness of the second dielectric layer to the total thickness of the first dielectric layer and the second dielectric layer is about 30% or less, and
wherein the degree of lattice mismatch between the lower electrode and the first dielectric layer is less than the degree of lattice mismatch between the lower electrode and the second dielectric layer.

15. The semiconductor device of claim 14, wherein the lower electrode and the upper electrode each includes at least one of SrRuO3, SrMoO3, SrIrO3, SrVO3, SrNbO3, or SrCoO3.

16. The semiconductor device of claim 14, wherein the first dielectric layer includes at least one of STO, BTO, or BSTO.

17. The semiconductor device of claim 14, wherein the first dielectric layer includes at least one of SrTiO3, BaTiO3, or (Ba, Sr)TiO3.

18. The semiconductor device of claim 14, wherein the first dielectric layer is one of a plurality of first dielectric layers, and the second dielectric layer is one of a plurality of second dielectric layers,
wherein the plurality of first dielectric layers and the plurality of second dielectric layers are alternately stacked on each other.

19. The semiconductor device of claim 18, wherein the plurality of first dielectric layers include two first dielectric layers, and the plurality of second dielectric layers include two second dielectric layers.

* * * * *